United States Patent [19]

Goronkin

[11] 3,906,541

[45] Sept. 16, 1975

[54] FIELD EFFECT TRANSISTOR DEVICES AND METHODS OF MAKING SAME

[75] Inventor: Herbert Goronkin, Dewitt, N.Y.

[73] Assignee: General Electric Company, Schenectady, N.Y.

[22] Filed: Mar. 29, 1974

[21] Appl. No.: 456,020

[52] U.S. Cl. ..................... 357/22; 357/41; 357/15; 357/55; 357/56; 357/71

[51] Int. Cl.[2] ............... H01L 29/80; H01L 29/48; H01L 29/06; H01L 29/46

[58] Field of Search ............. 357/22, 41, 55, 56, 71

[56] References Cited

UNITED STATES PATENTS

| | | | |
|---|---|---|---|
| 3,813,585 | 5/1974 | Tarui et al. | 357/41 |
| 3,821,785 | 6/1974 | Rose | 357/71 |
| 3,823,352 | 7/1974 | Pruniaux et al. | 357/23 |
| 3,832,248 | 8/1974 | Bazin et al. | 357/23 |

*Primary Examiner*—Michael J. Lynch
*Assistant Examiner*—E. Wojciechowicz
*Attorney, Agent, or Firm*—Julius J. Zaskalicky; Joseph T. Cohen; Jerome C. Squillaro

[57] ABSTRACT

Relates to MESFET and JFET field effect transistor devices in which the source and drain regions are formed in a substrate of high resistivity about selected surface portions on which projections or mesas are subsequently epitaxially grown to provide the channel regions of the devices. The selected surface portions are delineated by a small geometry mask. The projections are provided with overhanging portions which facilitate metallization of the various surface regions of the device without the need for separate masking.

10 Claims, 7 Drawing Figures

FIELD EFFECT TRANSISTOR DEVICES AND METHODS OF MAKING SAME

Figure 1:
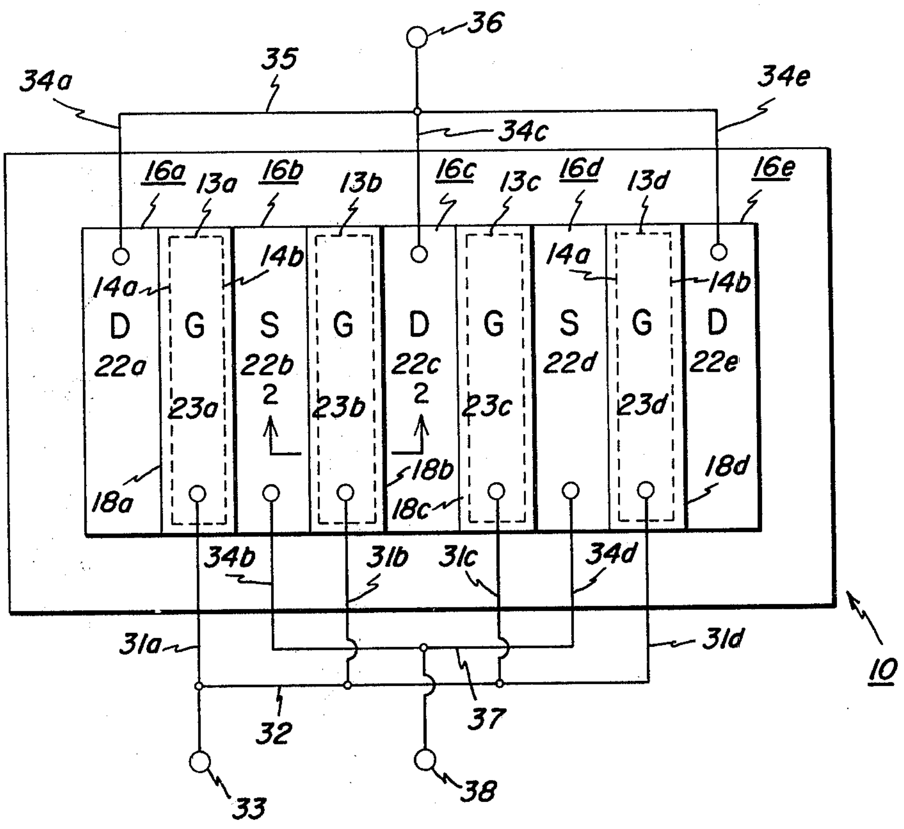

The present invention relates to field effect transistor devices of the MESFET (metal-semiconductor field effect transistor) and JFET (junction field effect transistor) varieties and to methods of making such devices. The invention herein described was made under a contract with the United States Department of the Air Force.

Present MESFET and JFET devices for operation above one gigaHertz require several ultra-high resolution fabrication masks which must be mutually registered with tolerances approaching small fractions of a micron. For fabricating such devices to provide high power (several watts) such tolerances must be maintained over semiconductor chip sizes of the order of 100 × 100 mils and to obtain reasonable chip yields such tolerances must be held across an entire wafer.

The present invention is directed to the provision of field effect transistor devices of the kind described above of improved structure which can be simply and economically fabricated.

An object of the present invention is to provide a process for making MESFET and JFET semiconductor devices in which the active regions thereof are self-aligned and in which only a single small geometry mask is required in the fabrication thereof.

Another object is to provide MESFET and JFET semiconductor devices of compact structure.

Still another object is to provide MESFET and JFET semiconductor devices which utilize a minimum of active semiconductor material with resultant minimization of power loss therein.

Still another object of the present invention is to provide MESFET and JFET semiconductor devices in which the need for cross-over lines interconnecting like electrodes is avoided.

A further object of the present invention is to provide MESFET and JFET semiconductor devices adapted for high gate-to-drain operating voltages.

In accordance with one illustrative embodiment of the invention, a substrate of semiconductor material of high resistivity having a major surface including an elongated surface region having a pair of opposed long edges is provided. A source region of a first conductivity type and of low resistivity is formed in the substrate contiguous to one of the elongated edges of the elongated surface region. Simultaneously a drain region of the same conductivity type is formed in the substrate contiguous to the other long edge of the elongated surface region. A projection of mesa of semiconductor material of the first conductivity type and of intermediate resistivity is epitaxially formed on the elongated surface region and extends outward from the major surface for a predetermined distance and thereafter extends substantially parallel to the major surface to provide portions which overhang the elongated surface region. Each of the exposed portions of the source region, the drain region and the projection are provided with a conductive layer for making electrical connections to the device.

A plurality of elemental devices such as described above may be formed on a substrate. In this connection a plurality of elongated surface regions are provided on the major surface of the substrate. The edges of each of the elongated surface regions are uniformly spaced along the length thereof. The elongated surface regions are spaced side by side relationship as distinguished from an end to end relationship. Each elongated surface region is equally spaced with respect to adjacent elongated surface regions. The spacing may also be tapered to facilitate electrical connections to the region of the device. A plurality of elongated regions of the first conductivity type and of low resistivity are provided in the substrate, each located between and contiguous to respective adjacent elongated regions. A plurality of mesas or projections of the first conductivity type and of intermediate resistivity are provided on the elongated surface regions, each extending outward from the major surface for a predetermined distance and thereafter extending substantially parallel to the major surface to provide portions overhanging the respective elongated surface region. The exposed portions of the elongated regions and the projections are provided with elongated conductive layers for making electrical connections to the device.

In accordance with another aspect of the present invention there is provided a substrate of semiconductor material of high resistivity including an elongated surface region having a pair of opposed long edges. A pair of elongated regions of the first conductivity type are formed in the substrate each contiguous in respective one of the long edges. An insulating layer is formed on the major surface of the substrate of a predetermined thickness except over the elongated surface region. Semiconductor material of the first type conductivity and of intermediate resistivity is then epitaxially grown on the elongated surface region to form a projection which extends outward from the major surface to the exposed surface of the insulating layer and thereafter extends therealong to provide portions overhanging the elongated surface region. The insulating or masking layer is removed. A vaporized metallic material is applied from a source onto the exposed portions of the projection and the elongated regions of the first conductivity type to provide the electrical terminals of the device. The overhang portions of the projection shadow mask the major surface of the substrate adjacent the long edges of the elongated surface region against metallization thereby avoiding the need for a fine geometry metallization mask.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein FIG. 1 is a plan view of a field effect transistor in accordance with the present invention.

Figure 2:
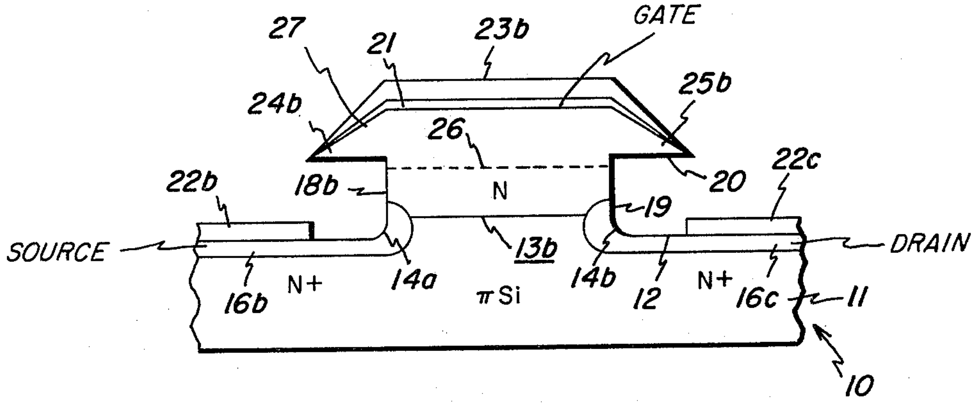

FIG. 2 is a sectional view of a portion of the device of FIG. 1 taken along section lines 2—2 showing the internal construction thereof and the manner of fabrication thereof.

FIGS. 3*a* through 3*e* are cross-sectional views of a portion of a semiconductor device, such as shown in FIG. 2, illustrating the steps in the fabrication of the device in accordance with the present invention.

Reference is now made to FIGS. 1 and 2 which show a field effect transistor 10 in accordance with the present invention. The device 10 is formed on a substrate 11 of monocrystalline silicon semiconductor material of very high resistivity. The substrate may have a resistivity in excess of 500 ohm-cm and may be 10 mils thick. On the major surface 12 of the substrate are provided a plurality of elongated surface regions 13*a*-13*d* each identical in form and each including a pair of long edges 14*a*-14*b* equally spaced along the length thereof. The elongated surface regions 13*a*-13*d* are uniformly spaced in side by side relationship along the major surface of the substrate. To facilitate electrical connections to the source and drain regions which lie between adjacent ones of the elongated surface regions 13*a*-13*d*, the spacing of adjacent long edges of adjacent elongated surface regions may be tapered. Electrical connections are made to those portions of source and drain regions which are wide. A plurality of elongated regions 16*a*-16*e* of N-type conductivity and low resistivity are provided in the substrate. Each of region 16*b*-16*d* is located between respective adjacent ones of elongated surface regions 13*a*-13*d* and in conductive engagement therewith. An elongated region 16*a* engages a single elongated surface region 13*a* along the length thereof and elongated region 16*e* engages elongated surface region 13*d*. The elongated regions 16*a*-16*e* may be formed by diffusion of appropriate donor activators into the substrate 11 from the surface 12 while masking the elongated surface regions. As the elongated regions 16*a*-16*e* are to function as source and drain regions the resistivity of the regions is made sufficiently low. Conveniently arsenic or antimony may be the activators utilized for imparting N-type conductivity to the elongated regions. From the exposed portions of the elongated surface regions 13*a*-13*d*, a plurality of projections 18*a*-18*d* or mesas are epitaxially grown. The projections are of N-type conductivity and of intermediate resistivity. Each of the projections extends substantially outward from the major surface 12 for a predetermined distance 19 and then extending laterally for a distance 20 comparable to predetermined distance 19 to overhang a respective elongated region. A layer 21 of platinum is sputtered onto the outward facing or exposed surfaces of the projections and is thereafter sintered to provide A Schottky barrier junction with respect to the projection. Thereafter the exposed portions of the elongated regions 16*a*-16*e* and the platinum covered outward surfaces of the projections are metallized to form the conductive terminals thereof. The conductive layers formed on the source regions 16*b*-16*d* are denoted 22*b* and 22*d*. The conductive layers formed on drain regions 16*a*, 16*c* and 16*e* are denoted 22*a*, 22*c* and 22*e*, respectively. The conductive layers on the projections 18*a*-18*d* and forming the gate electrodes are denoted 23*a*-23*d*. In the metallization process the substrate is disposed with respect to the source of metallization so that essentially line of sign metallization occurs with the overhanging portions of the projections functioning as a shadow mask for certain surface portions of the elongated regions and adjacent edges of elongated surface regions. This metallization is accomplished without need for a fine geometry metallization mask. The metallization may include two layers an initial layer of titanium which adheres well to silicon followed by a layer of molybdenum which adheres well to titanium and has good conduction characteristics.

In the process of epitaxially growing projections 18*a*-18*d*, the temperatures utilized cause a certain amount of diffusion of the activators in the elongated regions 16*a*-16*e* to diffuse into the substrate and into the projections to provide good conductive engagement therewith. The portion of the projections adjacent the major surface 12 of the substrate constitutes the channel regions through which conduction carriers from the source to the drain region flow.

While a Schottky barrier type control gate for the field effect transistor device has been shown, a PN junction may be provided to the projection to achieve the same end. In this connection a portion of the projections, for example that shown above the plane indicated by dotted line 26 may be suitably doped with acceptor activators to provide P-type conductivity therein. In this case the platinum contact 21 would provide an ohmic connection to the P-region 27 or it may be omitted.

Conductive connection to each of the gate electrodes 23*a*-23*d* is made by means to vertical leads 31*a*-31*d*, respectively, which in turn are connected to a horizontal lead 32 and to a gate terminal 33. Alternate ones of the elongated regions of N-type, i.e. regions 16*a*, 16*c* and 16*e* designated as drain electrodes and vertical leads 34*a*, 34*c* and 34*e*, respectively, make contact thereto. Vertical leads 34*a*, 34*c* and 34*e* are connected to a common horizontal lead 35 and the horizontal lead is connected to a drain terminal 36. Elongated regions 16*b* and 16*d* drain regions are designated source regions and vertical leads 34*b* and 34*d*, respectively, make contact thereto. Vertical leads 34*b* and 34*d* are connected to a horizontal lead 37 which in turn is connected to a source terminal 38.

For reasons of simplicity in illustrating and describing the field effect transistor devices FIGS. 1 and 2, the final glassification and overlying metallization has not been shown but has been indicated schematically by the manner of connection of the leads to the various electrodes of the device. The device of FIGS. 1 and 2 may be covered with glass, for example vapor deposit glass to completely enclose the electrodes in glass. Thereafter three rows of holes may be provided in the glass, one row for exposing the gate electrodes, another row for exposing the drain electrodes and a third exposing the source electrodes. Thereafter metallized strips may be provided over the enclosed glass structure to obtain the electrical connections illustrated in FIG. 1. The horizontal gate lead 32 would be formed by one stripe of metallization overlying the device. Each of the vertical leads 31*a*-31*d* would correspond to metallization extending through holes in the glass to the gate electrodes 23*a*-23*d*, respectively. Similarly, the horizontal drain lead 35 would represent another stripe of metallization overlying the glass and the vertical drain leads 34*a*, 34*b* and 34*d* would represent the metallization extending through the holes in the glass to the drain electrodes 22*a*, 22*d*, 22*e*, respectively. Finally, the horizontal source lead 37 would represent a third stripe of metallization overlying the glass and each of the vertical leads 34*b* and 34*d* would represent metallization extending through the holes in the glass to the source electrodes 22*b* and 22*d*, respectively.

A device such as described in FIGS. 1 and 2, in which the lateral spacing of the long edges 14*a* and 14*b* of the elongated surface regions is approximately 0.1 mil, the source and drain regions have an low resistivity of 0.01 ohm-cms., and the projections have an intermediate resistivity of 0.2 ohm-cms. would be suitable for operation at frequencies in the range of 4 and 8 gigaHertz.

Figure 3A:
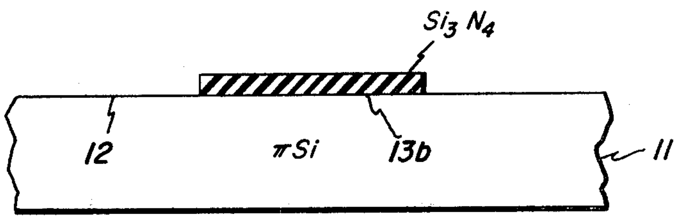

Reference is now made to FIGS. 3A through 3E which illustrate the manner of fabrication of the field effect transistor device of FIGS. 1 and 2. Initially, a wafer of monocrystalline silicon semiconductor material of high resistivity for example, 1000 ohm-cm having a convenient thickness, for example, 10 mils is obtained. After suitable cleaning of the surface a layer of silicon nitride about 1/10 of a micron thick is provided. Any of the conventional reactions for the deposition of silicon nitride on a surface of silicon may be utilized for this purpose, for example, the reaction of silane with ammonia with resultant formation of silicon nitride may be utilized. The silicon nitride layer is then patterned using conventional techniques including small geometry masks for precisely forming layers of silicon nitride overlying the elongated surface regions 13*a*-13*d* of the device of FIGS. 1 and 2, as illustrated in FIG. 3A for a single elongated surface region 13*b*.

Figure 3B:
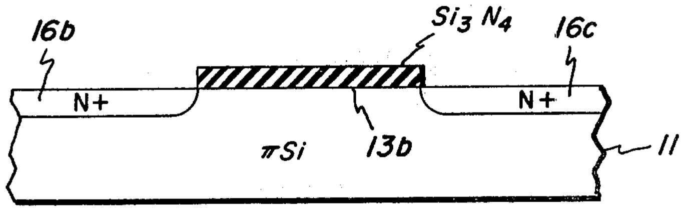
Figure 3C:
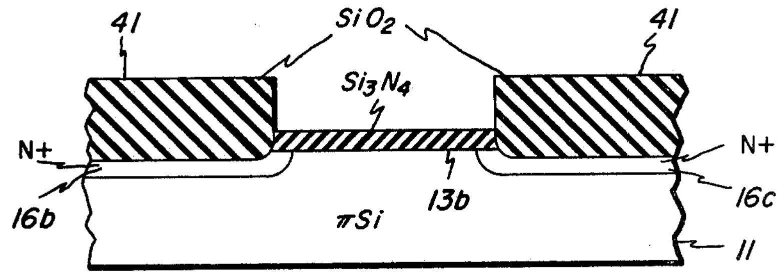

Thereafter utilizing the silicon nitride layers as a diffusion mask donor activators are diffused into the elongated regions 16*a*-16*c* lying between the elongated surface regions 13*a*-13*d* and covered by the silicon nitride layers. Conveniently, an activator containing glass may be deposited over the major surface 12 and diffusion effected therefrom into the substrate 11 to form regions of N-type conductivity and of low resistivity (N+) as shown in FIG. 3B. Conveniently the net activator concentration of donors in the regions 16*a*-16*e* may be quite high as these regions are to serve as source and drain regions of the field effect transistor. Activators or dopants which may be utilized are arsenic and antimony. Alternatively, the elongated regions 16*a*-16*e* may be formed by ion implantation of the donor activators. After formation of the elongated regions 16*a*-16*e* the major surface 12 of the substrate 11 is cleaned over areas not covered by the silicon nitride layer and a layer of silicon dioxide 41 is grown thereon to a convenient depth for example 1 micron, as illustrated in FIG. 3C. The silicon nitride layers are then removed and the exposed surface of the silicon suitably cleaned. Next, a projections or mesa N-type conductivity is epitaxially grown on the elongated surface regions 13*a*-13*d* which were protected by the layers of silicon nitride. A suitable process for this purpose is the hydrogen reduction of silicon tetrachloride. The growth proceeds from the major surface 12 outward to a distance representing the thickness of the oxide layer 41 and thereafter extends along the exposed surface of the oxide layer. In this process as lower surface energy is needed for nucleation of silicon on silicon as compared to silicon on silicon oxide, selective deposition of the silicon occurs on silicon and not on the silicon dioxide. The lateral extent of the deposition extends for a distance comparable to the outward extension along the thickness of the oxide to provide overhanging portions 24*b* and 25*b* which overlie the diffused source and drain regions of the device.

Figure 3D:
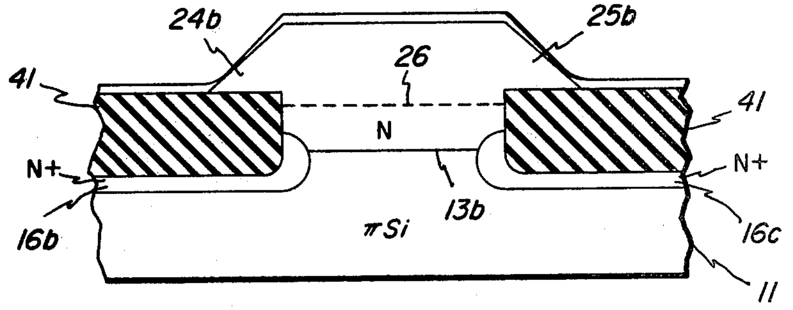

A layer of platinum is sputtered on the exposed surfaces of the epitaxial growths or projections including the oxide layer as shown in FIG. 3D. The platinum is sintered to form a Schottky barrier rectifying contact on the projections. Thereafter the silicon dioxide layer 41 is etched away. Finally, two layers of metallization, one an initial layer of titanium and thereafter a subsequent layer of molybdenum is evaporated onto the exposed surfaces of the projections 18*a*-18*d* and the diffused regions 16*a*-16*c*. The substrate or wafer 11 is so placed in a metallization chamber, for example, a metal evaporator, in respect to the source of metallization that the overhanging portions of the projections can shadow mask line of sight evaporation of metal onto the diffused regions 16*a*-16*e*. Thus the metallization of the device affected in a single step without the need for any additional masks, and in particularly small geometry masks.

Figure 3E:
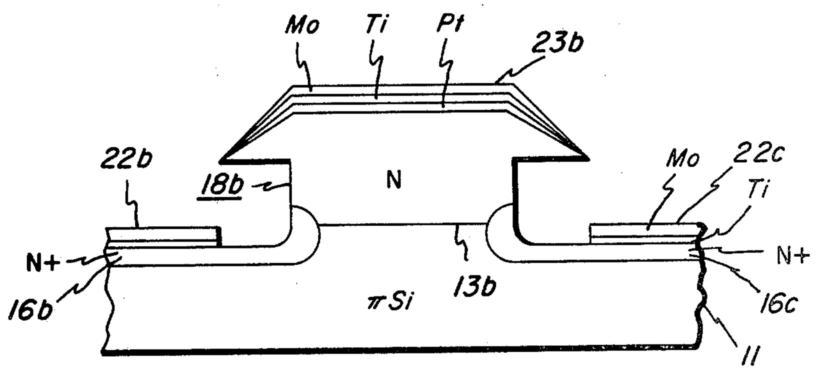

As pointed out in connection with FIGS. 1 and 2, structure of FIG. 3E then may be covered with a layer of glass, for example, chemically vapor deposited glass and three rows of holes may be formed in the glass. One row of holes exposes the metal gate electrodes of the device. A second row of holes exposes the drain electrodes of the device and a third layer of holes exposes the source electrodes of the device. A layer of metallization may then be applied over the surface of the glass and into the rows of holes. The metallization is then patterned to form three stripe electrodes, one constituting the gate terminal, another constituting the drain terminal and the third stripe constituting the source terminal.

If desired, each of the projections may be provided with an upper portion of P-type conductivity forming a PN junction with the lower portion thereof. In FIG. 3D, for example, the portion of the projection above plane 26 is made P-type conductivity. Introduction of suitable acceptor activators into the epitaxial growth process would form such a P-type portion. Such a region would be suitably highly doped to provide low resistivity. In this case the platinum contacts to the projections would provide an ohmic contact rather than a rectifying contact thereto.

Thus a method of fabricating MESFET and JFET devices has been described in which the active regions thereof are self aligned and which only a single small geometry mask is used in the fabrication thereof. The single small geometry mask is the mask utilized for the formation of the silicon nitride layers covering the elongated surface regions on the major surface of the substrate. Additional steps do not require small geometry masks and hence avoid the alignment problems thereof. A particular advantage of the device of FIGS. 1 and 2 is that the active region of the device represented by the projections or mesas are kept to a minimum with resultant low power losses. Good isolation of the source and drain region of the device is provided by the high resistivity silicon substrate. Since the gate junction has no curvature the device is suitable for high voltage operation and hence high power operation.

While the invention has been described in a specific embodiment it will be appreciated that modifications, such as those described above, may be made by those skilled in the art, and it is intended by the appended claims to cover all such modifications and changes as fall in the true spirit and scope of the invention.

What I claim as new and desired to secure by Letters Patent of the United States is:

1. A field effect transistor comprising a substrate of semiconductor material of high resistivity having a major surface including an elongated surface region having a pair of long edges, an elongated source region of a first conductivity type and of low resistivity in said substrate contiguous to one of said pair of edges of said elongated surface region, an elongated drain region of said first conductivity type and of low resistivity in said substrate contiguous to the other of said pair of long edges, a projection of semiconductor material of said first conductivity type and of intermediate resistivity on said selected elongated surface region extending outward from said major surface for a predetermined distance and thereafter extending substantially parallel to said major surface to provide portions overhanging said elongated surface region, said projection being an epitaxial extension of said substrate, each of the exposed portions of said source region and of said drain region having a respective conductive layer thereon, means forming a rectifying contact with said projection.

2. The device of claim 1 in which said opposed edges are substantially equally spaced along the length thereof.

3. The device of claim 1 in which each of the overhanging portions of said projection adjacent a respective one of said opposed edges extend for a distance over said major surface substantially equal to said predetermined distance.

4. The device of claim 1 in which said conductive layers are metallic layers.

5. The device of claim 1 in which said substrate and said projection are constituted of silicon semiconductor material.

6. The device of claim 1 in which said source region includes a portion of said projection contiguous to said one edge, and said drain region includes a portion of said projection contiguous to said other edge.

7. The device of claim 1 in which a first portion of said projection initially formed is of said first conductivity type and in which a second portion of said projection subsequentially formed is of a second conductivity type opposite to said first conductivity type.

8. The device of claim 1 in which said semiconductor material is silicon and said first conductivity type is N-type.

9. A field effect transistor comprising a substrate of semiconductor material of high resistivity having a major surface including a plurality of elongated surface regions, said elongated surface regions being aligned so that adjacent long edges of adjacent surface regions having a substantially uniform spacing along the length thereof, said spacing being the same for all adjacent long edges of adjacent surface regions, a plurality of elongated regions of a first conductivity type and of low resistivity in said substrate, each located between and contiguous to respectie adjacent elongated surface regions, a plurality of projections of semiconductor material of said first conductivity type and of intermediate resistivity, each being an epitaxial extension of said substrate from a respective elongated surface region and each extending outward from said major surface for a predetermined distance and thereafter extending substantially parallel to said major surface to provide portions overhanging said respective elongated surface region, each of the exposed portions of said elongated regions of said first conductivity type having a respective elongated conductive layer thereon, means forming rectifying contacts with said projections.

10. The device of claim 9 in which each of the elongated edges of the conductive layer on a respective region of said first conductivity type and the adjacent elongated edge of the conductive layer of an adjacent projection lying in a respective surface substantially orthogonal to said major surface.

* * * * *